United States Patent [19]

Fatemi et al.

[11] Patent Number: 5,294,834
[45] Date of Patent: Mar. 15, 1994

[54] LOW RESISTANCE CONTACTS FOR SHALLOW JUNCTION SEMICONDUCTORS

[75] Inventors: Navid S. Fatemi, University Heights; Victor G. Weizer, Cleveland Heights, both of Ohio

[73] Assignee: Sverdrup Technology, Inc., Tullahoma, Tenn.

[21] Appl. No.: 891,797

[22] Filed: Jun. 1, 1992

[51] Int. Cl.$^5$ .............................. H01L 23/48
[52] U.S. Cl. ............................ 257/745; 257/750; 257/751; 257/761; 257/763
[58] Field of Search ............ 257/745, 750, 751, 761, 257/763

[56] References Cited

PUBLICATIONS

V. G. Weizer and N. S. Fatemi, *Contact spreading and the $Au_3In_4$ transition in the Au-InP System*, J. Appl. Phys. 68(5, pp. 2275-2284 (1990).
N. S. Fatemi and V. G. Weizer, *The Effect of Metal Surface Passivation on the AU-InP Interaction*, J. Appl. Phys. 65(5), pp. 2111-2115 (1989).
N. S. Fatami and V. G. Weizer, *The Kinetics of Au-InP Interaction*, J. Appl. Phys. 67(4), pp. 1934-1939 (1990).

*Primary Examiner*—Mark V. Prenty
*Attorney, Agent, or Firm*—Watts Hoffman Fisher & Heinke

[57] ABSTRACT

A method of enhancing the specific contact resistivity in InP semiconductor devices and improved devices produced thereby are disclosed. Low resistivity values are obtained by using gold ohmic contacts that contain small amounts of gallium or indium and by depositing a thin gold phosphide interlayer between the surface of the InP device and the ohmic contact. When both the thin interlayer and the gold-gallium or gold-indium contact metallizations are used, ultra low specific contact resistivities are achieved. Thermal stability with good contact resistivity is achieved by depositing a layer of refractory metal over the gold phosphide interlayer.

14 Claims, 1 Drawing Sheet

LOW RESISTANCE CONTACTS FOR SHALLOW JUNCTION SEMICONDUCTORS

The invention described herein was made in performance of work under NASA Contract No. NAS-3-25266, and is subject to the provision of 305 of the National Aeronautics and Space Act of 1958, as amended, (42 U.S.C. § 2457).

BACKGROUND OF THE INVENTION

The invention relates to a device and method for low resistance contact to semiconductors. More specifically, the invention relates to low resistance contacts for shallow junction indium phosphide (InP) semiconductor devices.

There are numerous metal-InP contact systems where specific contact resistivities in the $10^{-6}$ $\Omega$-cm$^2$ range have been achieved. However, the achievement of low resistance electrical contact to InP has inevitably been accompanied by degradation of the InP itself. In order to obtain low resistivities the contacts have been either heat treated (sintered) after their deposition on the InP, or the InP lattice purposely damaged prior to metal deposition by energetic ion bombardment or the like in order to obtain low resistivity. Heat treatment after contact deposition causes the dissolution of substantial amounts of InP into the contacting metallization. Unless careful control of the heat treatment is maintained the dissolution will destroy the InP device being contacted. Even with careful control, there is a trade-off between achieving low contact resistance and inflicting mechanical and electrical damage on the InP device. The generation of lattice damage in the InP prior to metal deposition, typically by ion etching or sputter deposition of the contact metallization, also degrades the electrical characteristics of the InP device by generating a region of very low minority carrier lifetime and high recombination velocity in the device. While these effects can be tolerated in some very deep junction devices, they are extremely harmful in shallow junction devices such as solar cells and junction gated field effect transistors (JFETs). Some ultra-low specific contact resistivities in the $10^{-7}$ $\Omega$-cm$^2$ range have also been reported for several metal-InP couples, but these extremely low values have never been achieved without post-deposition heat treatment or pre-deposition lattice damage.

Another problem that has plagued InP semiconductors is their poor stability at high temperatures. Intentional or unintentional exposure of InP devices to elevated temperatures, e.g., greater than about 350° C., for extended periods of time, e.g., greater than about 10 minutes, will result in the destruction of all but the deepest junction devices. In attempts to provide contacts that could be used at elevated temperatures refractory metals have been used to augment the contact metallization. While refractory metals do not react destructively with InP at high temperatures, e.g., 400° C., they also do not form low resistance contacts. Thus, they are always used in conjunction with other metals that do form low resistance contact to InP. These metals still require process steps that result in degradation of the semiconductor device.

Recent work by the inventors has shown that during sintering, or other heat treatment, gold-InP systems progress through at least three phase changes. During these three stages, all of which are solid state in nature, both indium (In) and phosphorus (P) leave the semiconductor and enter the metallization. In the first stage, which continues until the In content in the Au lattice of the contact metallization reaches the solid solubility limit, In atoms enter the metallization interstitially and diffuse until encountering vacant sites in the Au lattice, at which point they take substitutional positions on the Au lattice by annihilating the vacancies. In the second stage, the saturated Au(In) solid solution is converted to Au$_3$In. During this stage In atoms again enter the metallization interstitially, but here they diffuse to the Au-(In)/Au$_3$In interface where they displace substitutional Au atoms into interstitial positions. The interstitial Au atoms thus formed then diffuse to and react with newly released P atoms from the InP to form Au$_2$P$_3$ at the metal-semiconductor interface. The rate of entry of In into the metallization is the rate limiting step in this second stage. In the third stage, the Au$_3$In is converted to Au$_9$In$_4$, also by displacing substitutional Au atoms into interstitial positions, but the rate limiting step here is believed to be this displacement or exchange step itself. A thorough discussion of the metallurgical and electrical interactions and mechanisms occurring in InP semiconductor systems is found in V. G. Weizer and N. S. Fatemi, J. Appl. Phys. 69(12), 8253 (1991), and N. S. Fatemi and V. G. Weizer, J. Elect. Mat., 20(10) 875 (1991), both of which are incorporated herein by reference.

SUMMARY OF THE INVENTION

A solution to the degradation problem is to eliminate the need for pre-deposition lattice damage or post-deposition heat treatment of the contacts and thus avoid the device destroying metallurgical interactions that accompany these processes. It has now been discovered that low specific contact resistivity ($R_c$) is achieved according to the invention by introducing a gold phosphide (Au$_2$P$_3$) interlayer between the surface of the InP and the overlying contact metallization prior to contact deposition. Low specific contact resistivity values are obtained without the need for post-deposition heat treatment or pre-deposition lattice damage. Contact formation does not degrade the electrical characteristics of the underlying semiconductor device, regardless of the proximity of the n/p junction to the surface, and contacts so formed retain their size and shape since they undergo no post-deposition heat treatment or pre-deposition lattice damage. It has also been discovered that low contact resistivities are also obtained by introducing small amounts of gallium (Ga) or indium (In) into the contact metallization. Surprisingly, the effect of the introduction of the gold phosphide interlayer and the effect of using Au-In or Au-Ga alloys as contact metallization are additive. As a result of this synergy, ultra low specific contact resistivities are obtainable when the device is comprised of both the gold phosphide interlayer and an ohmic contact metallization comprised of gold and either gallium or indium. Moreover, by using refractory metals as the overlying contact metallization in combination with the thin gold phosphide interlayer low contact resistivities can be achieved without degradation of the underlying InP semiconductor even after being exposed to elevated temperatures for extended periods.

It is therefore an object of the invention to provide a method of reducing the specific contact resistivity of indium phosphide semiconductor devices whereby an improved indium phosphide semiconductor device is produced. The resistivity is improved by adding Ga or In to gold contact metallization or introducing a thin gold phosphide layer between the InP and the contact metallization prior to the deposition of the metallization. When both Ga or In additions to the overlying gold contact metallization and the gold phosphide interlayer are used, the contact resistivity is even further reduced. When the device is to be used at elevated temperatures, the overlying contact metallization may be formed of a refractory metal, such as tantalum, tungsten or molybdenum. In this system good contact resistivities are maintained with the use of the gold phosphide interlayer and the system remains stable at elevated temperatures.

Many additional features, advantages and a fuller understanding of the invention will be had from the following detailed description of the invention.

DETAILED DESCRIPTION OF THE INVENTION

Figure 1:
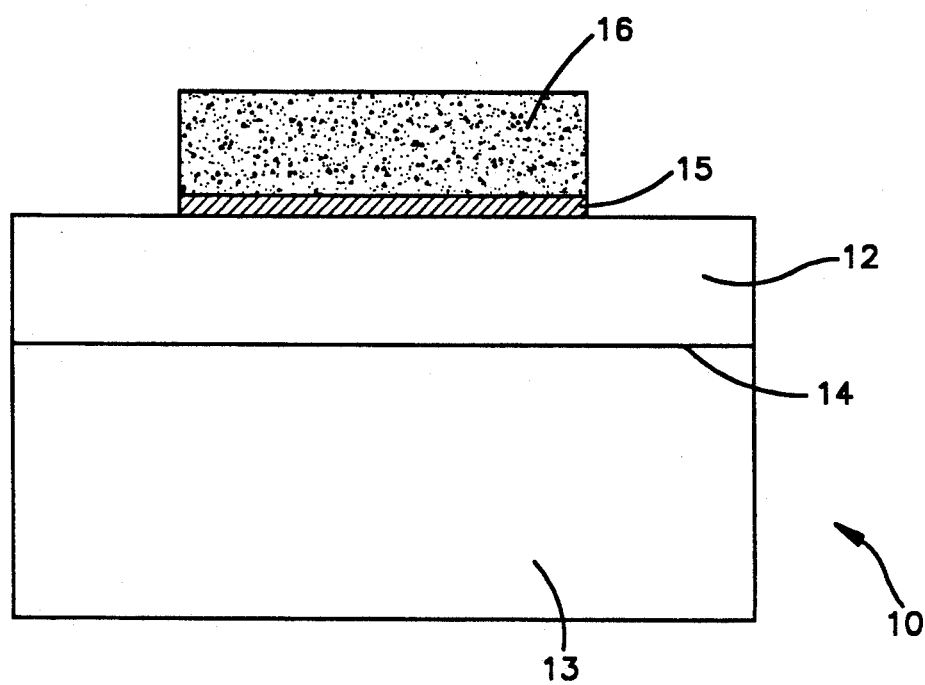
FIG. 1 is a diagrammatic cross-sectional view of a device according to the invention.

FIG. 1 shows the general configuration of a device constructed according to the invention. A semiconductor device 10 is shown comprising a first layer 12 of n-InP and a second layer 13 of p-InP. The interface between the two layers is the n/p junction 14. The n-InP layer is relatively thin as compared with the p-InP layer indicating a shallow junction device. The term "shallow junction" refers to the relative depth of the n/p junction 14 from the surface of the device where the contact metallization is deposited. Although the term is relative, typical shallow junction devices have a top InP layer, i.e., emitter, ranging anywhere from less than 2000 Å to around 1 micron in thickness and are commonly used in, for example, JFETs and solar cells. A thin layer 15 of gold phosphide ($Au_2P_3$) is deposited on the surface of the InP semiconductor to form an interlayer between the InP and the current carrying metallization 16 disposed thereover. It is to be understood that the form of the device depicted in FIG. 1 has been chosen only for the purpose of describing a particular embodiment and function of the invention, and that variations in the configuration of the semiconductor device will be apparent to one of ordinary skill in the art in view of the instant disclosure. For example, as shown, the gold phosphide interlayer 15 is a single continuous layer. However, as the thickness of the interlayer is decreased and approaches ultra thin 20 to 30 Å thicknesses, the interlayer occurs as islands of gold phosphide interspersed between the surface of the InP semiconductor and the contact metallization.

The current carrying contact metallization 16 disposed over the gold phosphide interlayer can be any low resistance contact material known to those of ordinary skill in the art. However, the inventors have surprisingly found that significant reductions in the specific contact resistivities can be obtained when the overlying contact metallization is formed from gold and small amounts of gallium or indium. Additionally, thermal stability may be imparted while maintaining good $R_c$ values when the overlying contact metallization is formed from a refractory metal and deposited over the gold phosphide layer.

The Effect of Gallium and Indium Additions

As noted above, Au-InP systems undergo a series of metallurgical reactions upon heating that involve the dissolution of indium from the InP into the contact metallization. Gallium additions drastically reduce the dissolution of InP into the metallization by inhibiting the interstitial entry of In into the Au lattice. While not wanting to be bound by theory, it is likely that Ga, in slowing the entry rate, permits the dissipation of the phosphorus atoms that are released at the Au-InP interface when In interstitially enters the metallization. This results in a decrease in the amount of accumulated phosphorus at the interface. The addition of as little as 1 at % Ga to the Au contact metallization significantly retards both the stage 2 (Au to Au(In) solid solution) and stage 3 (Au(In) to $Au_3In$) reactions, and the introduction of 9 at % Ga effectively stops them, even after extended periods at elevated temperatures. It is noted, however, that the effectiveness of Ga additions less than about 5 atomic % decreases with time even at room temperature.

The metallurgical effects of the addition of small amounts of gallium to the gold contacts are accompanied by significant electrical effects on the system that result in a tenfold reduction in the specific contact resistance. It is believed that the decrease in the amount of phosphorus that would otherwise accumulate at the semiconductor-metallization interface allows for the drop in the resistivity. With the addition of 9 at % Ga, the as-fabricated contact resistance, i.e., the resistance of the device after contact deposition without any post-deposition heat treatment or pre-deposition lattice damage, is an order of magnitude lower than when Au-only contacts are used. $R_c$ values in the high $10^{-5}$ ohm cm$^2$ range are easily obtained. The divergence in the contact resistances approaches two orders of magnitude as the temperature is raised to the 250°-300° C. range, although the resistance gains are quickly lost as the temperature approaches 400° C. Nevertheless, the presence of Ga does prevent the diode-destroying dissolution of InP into the contact metallization even though raising the temperature above 300° C. increases resistance. Similarly, the addition of only 1 at % Ga also results in as-fabricated resistances an order of magnitude lower than for gallium free contacts. However, the smaller amount of gallium does not appear to prevent diode degradation at elevated temperatures.

Contact resistivity can also be lowered by purposely saturating the Au contact metallization with In. Since low temperature In entry stops once the In concentration reaches the solid solubility limit, a saturated Au(In) solid solution contact system will preclude entry of additional In at low temperatures. Thus, Au-In mixtures having an In content greater than about 10 atomic % will result in an order of magnitude drop in the contact resistivity.

In addition, while Au-In mixtures having an In content greater than about 10 atomic % retard diode destroying dissolution of InP, the addition of sufficient In to Au to form the compound $Au_9In_4$ has the effect of completely arresting the InP dissolution.

Effect of $Au_2P_3$ Interlayer

As noted above, the stage 2 metallurgical transition occurring in the Au-InP system results in the formation of $Au_2P_3$ at the interface between the InP semiconductor and the contact metallization. Unfortunately, this is also accompanied by the dissolution of substantial amounts of InP into the contact metallization. If the dissolution goes unchecked, the underlying InP device is destroyed. However, by purposely introducing a very thin interlayer of gold phosphide at the surface of the InP prior to contact deposition, the low-contact resistance attendant to $Au_2P_3$ formation can be maintained while at the same time avoiding the destructive effects of InP dissolution. As fabricated resistivity values in the high $10^{-6}$ to low $10^{-5}$ ohm $cm^2$ range are obtained by this method. While there is no theoretical upper limit to the thickness of the gold phosphide interlayer, good results are obtained at thicknesses ranging from about 20 Å to about 40 Å or greater.

The contact resistivity reductions obtained by adding Ga or In to Au contacts and the reduction effected by adding an $Au_2P_3$ interlayer are additive. By depositing, for example, Au-9 at. % Ga or an Au-In mixture as the contact metallization over a thin $Au_2P_3$ interlayer, ultra low as-fabricated $R_c$ values in the $10^{-7}$ ohm-$cm^2$ are achieved. The additive nature of these effects, while not completely understood, is synergistic. However, maintaining these ultra-low resistivity values while preventing semiconductor dissolution as the temperature is increased appears to be more difficult with the presence of the gold phosphide interlayer. Although little or no metal-semiconductor metallurgic reaction occurs when the Au-Ga/$Au_2P_3$ contact system is heated at temperatures in the 300° to 400° C. range, the value of $R_c$ is sensitive to the temperature increases and rises two orders of magnitude after only 10 minutes at 350° C. It is believed that at these elevated temperatures the interlayer physically separates from the InP by accumulation of vacancies that are generated when In from the InP enters the metallization interstitially. If Ga were not present in the metallization, the vacancies generated at the interface would be annihilated by capturing interstitial Au atoms formed during the Au to $Au_3In$ phase transition, stage 2 in the series of metallurgical reactions between gold and InP. The result would be the formation of additional $Au_2P_3$ at the interface. However, since Ga has been shown to prevent Au interstitial formation, the vacancies, rather than being annihilated, accumulate at the InP interface where they eventually cause physical separation. Therefore, unless vacancy accumulation can be prevented, one must avoid post-fabrication heat treatment of the Au-Ga/$Au_2P_3$ contact system.

Unlike the Au-Ga/$Au_2P_3$ contact system, the Au-In/$Au_2P_3$ system is electrically more stable at elevated temperatures. Specifically, the $Au_9In_4$/$Au_2P_3$ contact system not only exhibits no change in its contact resistivity when heat treated at the 350° C. range for more than eight hours, but also during this heat treatment no diode destroying dissolution of InP occurs.

If the device is to be used at elevated temperatures, good specific contact resistivities can also be obtained with good thermal stability by replacing the Au based contact metallization over the gold phosphide interlayer with more metallurgically inert refractory metals. Thus, after forming an $Au_2P_3$ interlayer on the InP device, metals such as tungsten (W), tantalum (Ta), molybdenum (Mo) or the like, or alloys thereof, can be disposed over the interlayer as the contact metallization. The use of refractory metal instead of Au for the overlying contact metallization does not significantly affect the value of the as-fabricated contact resistivity due to the presence of the interlayer. Values in the low $10^{-5}$ ohm-$cm^2$ range are easily obtained. Moreover, these contacts do not react destructively with the InP. Contact resistance remains low and no significant metallurgical reaction occurs with the InP substrate. Thus, the substitution of refractory metals for Au in the overlying contact metallization preserves low contact resistivity while at the same time preventing the high temperature InP-metal interactions that would otherwise destroy shallow junction devices.

In the method of the invention the deposition of the $Au_2P_3$ interlayer on InP may be accomplished by a variety of techniques including sputtering, chemical vapor phase deposition, physical vapor deposition and the like, all of which are known to those of ordinary skill in the art. In a preferred method according to the invention, a simple technique that makes use of a negligible amount of phosphorus from the InP substrate and an electron beam deposited gold (Au) layer creates the $Au_2P_3$ interlayer on the InP surface. An extremely thin layer of about 30 to 50 Å of pure Au is electron beam deposited on the surface of the InP. This layer is then heat treated in an inert atmosphere at 400° C. for 3 minutes so that it will metallurgically react with the InP to form the alloy $Au_2P_3$ on the surface of the InP (stage 2). Since the Au layer is extremely thin only a negligible amount of InP is involved in the reaction to form the alloy so that the underlying shallow n/p junction is not adversely effected. However, if a different method is used to deposit the gold phosphide layer directly on the InP without making use of the phosphorus from the InP substrate, any thickness of gold phosphide interlayer can be used without degrading the n/p junction. For example, RF (radio frequency) Sputter Deposition is a well known technique suitable for this purpose involving the acceleration of ions through a potential gradient and the bombardment of these ions of a "target" or cathode. Through momentum transfer, atoms near the surface of a target material, here the target material being $Au_2P_3$, become volatile and are transported as a vapor to the substrate, here InP. At the substrate a film that is the same composition as the target material is deposited. Another well known technique suitable for depositing the gold phosphide interlayer of the invention is Chemical Vapor Deposition (CVD). Here chemical precursors, e.g. gold and phosphorus, are combined in a controlled fashion inside a reactor chamber. The precursors are allowed to react to form the desired material, e.g., gold phosphide, and then deposited onto the substrate. Metals and semiconductors are routinely deposited by this technique. Similarly, Electron Beam Deposition may also be used where high energy electrons are impinged onto a target of the material to be deposited in a vacuum. This causes vaporization and subsequent deposition of the material vapors onto the substrate.

As with the deposition of the gold phosphide interlayer, overlying current carrying metallization of a desired thickness may be deposited on the thin interlayer by a variety of methods known to those of ordinary skill in the art such as sputtering, electroplating, chemical vapor deposition, electron beam deposition and the like. This overlayer, whose function is to carry electric current to or from the device can be any low resistance metal such as Au, refractory metal etc. The Au/$Au_2P_3$ contact systems prepared according to this method exhibit an average metal-semiconductor specific contact resistivity of $8.6 \times 10^{-6}$ $\Omega$-$cm^2$ on InP with a typical n-type doping density of $1.7 \times 10^{18}$ $cm^{-3}$. In contrast, conventional as-fabricated contact systems on n-InP in which the underlying semiconductor is not degraded by metal-InP metallurgical interactions exhibit contact resistivities in the high $10^{-4}$ to low $10^{-3}$ $\Omega$-cm$^2$ range. In a preferred embodiment Au-Ga mixtures where the Ga content can vary from less than 1 atomic percent to 30 atomic percent, are deposited via electron beam evaporation on top of the Au$_2$P$_3$ interlayer on InP. The lowest specific contact resistivity obtained with this contact system on InP with an n-type doping density of $1.7 \times 10^{18}$ cm$^{-3}$ was $8.5 \times 10^{-7}$ $\Omega$-cm$^2$. The n/p shallow junction diode over which this metallization was deposited showed no sign of degradation.

EXAMPLE

An n/p diode with an epitaxially deposited (100) oriented InP emitter Si doped to $1.7 \times 10^{18}$ cm$^{-3}$ having a 2000 Å junction depth was prepared for transmission line method (TLM) resistance measurements. The substrate doping with Zn was $8 \times 10^{16}$ cm$^{-3}$. The gold phosphide interlayer was formed by depositing a 40 Å Au layer on the InP and annealing it for a few minutes at 395° C. The result is an array of Au$_2$P$_3$ islands approximately 0.5 micrometers in diameter and several micrometers apart under a thin layer of Au$_3$In. It should be noted that the Au$_3$In layer is only present here because this deposition method relies on the stage 2 metallurgical reaction between Au and InP to derive the phosphorus for the interlayer. This layer is not necessarily present when other methods of depositing the interlayer are used.

Contact deposition was by electron beam evaporation during which the substrates were not actively cooled. The pressure during evaporation was in the mid $10^{-6}$ Torr range. A metal thickness of 2000 Å was used for Au only contacts. Gallium was introduced into the metallization by sandwiching either a 200 or 20 Å Ga layer between two 900 Å Au layers. The former, upon thorough mixing, results in a 9 at % Ga/Au mixture, and the later in a 1 at % mixture. Low temperature heat treatment prior to sintering at elevated temperatures was needed to homogenize the Ga content.

In a variant of the above example, Au-In mixtures where the In content can vary from less than 1 atomic percent to 40 atomic percent, were deposited via electron beam evaporation on top of the gold phosphide interlayer on n-InP. The lowest metal-semiconductor specific contact resistivity measured with this contact system on InP with an n-type doping density of $1.7 \times 10^{18}$ cm$^{-3}$ was $7.7 \times 10^{-7}$ $\Omega$-cm$^2$. As with the Au-Ga/Au$_2$P$_3$ system, no junction degradation was observed with the n/p diodes.

Refractory metal ohmic contacts can be deposited by a variety of techniques known to those of ordinary skill in the art including, sputtering, electroplating, electron beam evaporation and the like. In a preferred method, both tungsten (W) and tantalum (Ta) overlayers were electron beam deposited in vacuo. The contact resistivities of these contacts retain their low values in the low $10^{-5}$ $\Omega$-cm$^2$ range, showing little variation with time at 400° C. Similarly, the n/p shallow junction diodes over which these contacts were deposited showed a forward voltage of about 900 mV at 1 mA (diode area of $5.6 \times 10^{-3}$ cm$^2$), indicating that the shallow junction under the contacts was not affected by metallurgical reaction at the metal-InP interface at 400° C. In contrast, heat treatment of conventional contacts at this temperature will destroy shallow junction devices in a matter of minutes.

It should be noted that the contact resistivity of the contact systems according to the invention were measured by the transmission line method (TLM). Although TLM is the most popular method of measuring contact resistivity, other methods such as the Cox and Strack method are used throughout the industry. The geometric test structure of this method was defined by the process of photolithography. The surface of the InP can be cleaned by many different solutions including phosphoric acid and hydrofluoric acid prior to metal deposition.

Many modifications and variations of the invention will be apparent to those of ordinary skill in the art in light of the foregoing disclosure. Therefore, within the scope of the appended claims, the invention can be practiced otherwise than is specifically shown and described.

What is claimed is:

1. In a shallow junction multilayer indium phosphide semiconductor device comprising first and second layers of indium phosphide, one of said layers being n-type InP and the other of said layers being p-type InP so as to form a semiconductor junction therebetween, and current carrying contact metallization disposed on a surface of said first layer, the improvement wherein a layer of Au$_2$P$_3$ is disposed between said overlying contact metallization and said surface of said first layer of indium phosphide prior to the deposition of said overlying contact metallization, and wherein said first layer of the indium phosphide is devoid of pits that breach said shallow semiconductor junction caused by a depletion of phosphorus from said first layer to form said Au$_2$P$_3$, whereby low specific contact resistivities are obtained.

2. The improvement according to claim 1 wherein said contact metallization comprises gold and an element selected from Gallium and Indium.

3. The improvement according to claim 1 wherein said contact metallization comprises a refractory metal.

4. The improvement according to claim 3 wherein said refractory metal is selected from the group consisting of tantalum, tungsten and molybdenum.

5. The improvement according to claim 2 wherein said contact metallization comprises gold and up to about 40% indium.

6. In a low contact resistance multilayer indium phosphide semiconductor device comprising first and second layers of indium phosphide, one of said layers being n-type InP and the other of said layers being p-type InP so as to form a semiconductor junction therebetween, and current carrying contact metallization disposed on a surface of said first layer, the improvement wherein a layer of Au$_2$P$_3$ is disposed between said overlying contact metallization and said surface of said first layer of indium phosphide prior to the deposition of said overlying contact metallization, and wherein the phosphorus in said Au$_2$P$_3$ layer is in addition to and not derived from the phosphorus in said first layer of indium phosphide, whereby low specific contact resistivities are obtained.

7. The improvement according to claim 6 wherein said contact metallization comprises gold and an element selected from Gallium and Indium.

8. The device according to claim 6 wherein said contact metallization comprises gold and up to about 40% indium.

9. The improvement according to claim 6 wherein said contact metallization comprises a refractory metal.

10. The improvement according to claim 9 wherein said refractory metal is selected from the group consisting of tantalum, tungsten and molybdenum.

11. A low contact resistance multilayer indium phosphide semiconductor device comprising first and second layers of indium phosphide, one of said layers being n-type InP and the other of said layers being p-type InP so as to form a shallow semiconductor junction therebetween, and current carrying contact metallization disposed on a surface of said first layer, and a layer of $Au_2P_3$ is disposed between said overlying contact metallization and said surface of said first layer of indium phosphide, said device produced by the process of depositing a thin layer of gold on said first layer of indium phosphide prior to the deposition of said overlying contact metallization, heating said device to react said gold with an amount of phosphorus in said first layer of indium phosphide that is insufficient to breach said shallow semiconductor junction, and thereafter depositing said current carrying contact metallization on the thus formed $Au_2P_3$ layer, whereby low specific contact resistivities are obtained.

12. The improvement according to claim 1 wherein said contact metallization is gold.

13. The improvement according to claim 11 wherein said thin layer of gold is from about 30 to about 50 angstroms thick.

14. The improvement according to claim 1 wherein said first layer is no greater than about 2000 angstroms thick.

* * * * *